(12) United States Patent
Lee

(10) Patent No.: US 9,297,496 B2
(45) Date of Patent: Mar. 29, 2016

(54) PLUG-IN MODULE BOTTOM RAIL SYSTEM AND METHOD

(71) Applicant: Brocade Communications Systems, Inc., San Jose, CA (US)

(72) Inventor: Michael K. T. Lee, San Jose, CA (US)

(73) Assignee: BROCADE COMMUNICATIONS, INC., San Jose, CA (US)

( * ) Notice: Subject to any disclaimer, the term of this patent is extended or adjusted under 35 U.S.C. 154(b) by 96 days.

(21) Appl. No.: 14/160,177

(22) Filed: Jan. 21, 2014

(65) Prior Publication Data

US 2015/0102191 A1   Apr. 16, 2015

Related U.S. Application Data

(60) Provisional application No. 61/889,664, filed on Oct. 11, 2013.

(51) Int. Cl.
| | |
|---|---|
| *H05K 7/14* | (2006.01) |
| *H05K 7/18* | (2006.01) |
| *F16M 13/02* | (2006.01) |

(52) U.S. Cl.
CPC ............. *F16M 13/02* (2013.01); *H05K 7/1421* (2013.01); *H05K 7/186* (2013.01)

(58) Field of Classification Search
CPC ...... F16M 13/02; H05K 7/186; H05K 7/1421
See application file for complete search history.

(56) References Cited

U.S. PATENT DOCUMENTS

| | | | | | |
|---|---|---|---|---|---|
| 3,878,438 | A * | 4/1975 | Weisman | ............. | H05K 7/1418 211/41.17 |
| 4,669,616 | A * | 6/1987 | Mazura | ................. | H05K 7/183 211/41.17 |
| 5,031,074 | A * | 7/1991 | Ravid | ................. | H01R 12/7005 211/41.17 |
| 5,213,370 | A * | 5/1993 | Hood | ...................... | B42D 3/00 281/29 |
| 5,938,050 | A * | 8/1999 | Roesner | ............... | H05K 7/1418 211/162 |
| 6,038,126 | A * | 3/2000 | Weng | ...................... | G06F 1/189 312/223.2 |
| 6,646,890 | B1 * | 11/2003 | Byers | ................... | H05K 7/1418 211/41.17 |
| 7,167,380 | B2 * | 1/2007 | Ice | ...................... | H05K 7/1418 361/727 |
| 7,170,749 | B2 * | 1/2007 | Hoshino | ................. | G06F 1/185 361/718 |
| 7,258,381 | B2 * | 8/2007 | Sturt | ...................... | E05B 83/32 296/24.34 |

(Continued)

OTHER PUBLICATIONS

Lee, "Bottom Rail Systems for Plug-In Module and FRUs for Fix-Form-Factor Chasses", U.S. Appl. No. 61/889,664, filed Oct. 11, 2013.

(Continued)

*Primary Examiner* — Jeanette E Chapman
(74) *Attorney, Agent, or Firm* — Innovation Counsel LLP; Serge J. Hodgson

(57) ABSTRACT

Bottom mounting rails are used to secure a double wide plug-in module or two full wide plug in-modules into a double wide bay of an electronic device. This allows the size of the electronic device to be minimized. Further, the space adjacent to the sides of plug-in modules is left open facilitating airflow through the electronic device and efficient cooling thereof. The bottom mounting rails allow either a double wide plug-in module or two full wide plug-in modules to be readily installed.

16 Claims, 11 Drawing Sheets

(56) References Cited

U.S. PATENT DOCUMENTS

| | | | | |
|---|---|---|---|---|
| 7,489,522 B2 * | 2/2009 | Hoshino | ............... | H05K 7/1418 174/520 |
| 7,920,387 B2 * | 4/2011 | Barrett | ................. | H05K 7/1418 361/741 |
| 7,983,052 B2 * | 7/2011 | Jiang | ...................... | H04Q 1/142 361/638 |
| 8,047,383 B2 * | 11/2011 | Hendrix | ............... | H05K 7/1418 211/26 |
| 8,561,815 B2 * | 10/2013 | Higson | .................. | H05K 7/183 211/41.17 |
| 2001/0044224 A1 * | 11/2001 | Kupnicki | ............... | H01R 12/89 439/62 |
| 2004/0032715 A1 * | 2/2004 | Ice | ....................... | H05K 7/1404 361/679.01 |
| 2007/0086175 A1 * | 4/2007 | Davis | ................... | H05K 7/1435 361/802 |

OTHER PUBLICATIONS

Installing or replacing fan trays, Brocade FastIron ICX 6610 Stackable Switch Hardware Installation Guide, R07.4.00, Part No. 53-1002504-02, retrieved on Feb. 24, 2014 from http://www.brocade.com/downloads/documents/html_product_manuals/FI_ICX6610_0740 . . . .

* cited by examiner

PLUG-IN MODULE BOTTOM RAIL SYSTEM AND METHOD

RELATED APPLICATIONS

This application claims the benefit of U.S. Provisional Application No. 61/889,664 filed on Oct. 11, 2013, entitled "Bottom rail system for plug-in module and FRUs for fix-form-factor chasses" of Michael K. T. Lee, which is incorporated herein by reference in its entirety.

BACKGROUND

1. Field

The present application relates to the field of electronics, and more particularly, to structures for mounting electronic components and related methods.

2. Description of the Related Art

An electronic device such as a switch typically includes a plurality of electronic components contained within an electronic enclosure. In one example the electronic components are provides as plug-in modules, sometimes called Field Replaceable Units (FRUs). These plug-in modules plug into and out of the motherboard of the electronic device with blind mate connectors.

The plug-in modules are field replaceable. More particularly, the electronic device includes sidewall dividers which guide the plug-in modules during insertion into the electronic device. Further, after insertion, the plug-in modules are fixed in position by threading screws of the plug-in modules to the sidewall dividers.

Unfortunately, the sidewall dividers occupy space within the electronic device thus restricting minimization of the size of the electronic device. Further, the sidewall dividers block airflow through the electronic device leading to inefficient cooling of the electronic device.

Further, to allow the plug-in modules to be mixed and matched, the plug-in modules have predefined widths. For example, a full (single) wide plug-in module has a defined width, a double wide plug-in module has approximately twice the defined width, a triple wide plug-in module has approximately three times the defined width, and so forth.

Each plug-in module is located between two sidewall dividers. Unfortunately, this requires a sidewall divider to be removed in the event two side by side full wide plug-in modules are replaced by a double wide plug-in module as an example. Conversely, this requires a sidewall divider to be installed in the event a double wide plug-in module is replaced by two side by side full wide plug-in modules. However, removal or installation of side wall dividers in the field is difficult.

SUMMARY

In accordance with one embodiment, bottom mounting rails are used to secure a double wide plug-in module or two full wide plug in-modules into a double wide bay of an electronic device.

By using the bottom mounting rails, allocation of space adjacent to the sides of the plug-in modules for mounting structures such as sidewall dividers is avoided. This allows the size of the electronic device to be minimized.

Further, the space adjacent to the sides of plug-in modules is left open facilitating airflow through the electronic device and efficient cooling thereof.

Further, using the bottom mounting rails, either a double wide plug-in module or two full wide plug-in modules can readily be installed without removal or insertion of a mounting structure such as a sidewall divider. Accordingly, removal or installation of sidewall dividers in the field to accommodate different types of plug-in modules is avoided.

These and other features in accordance with various embodiments will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
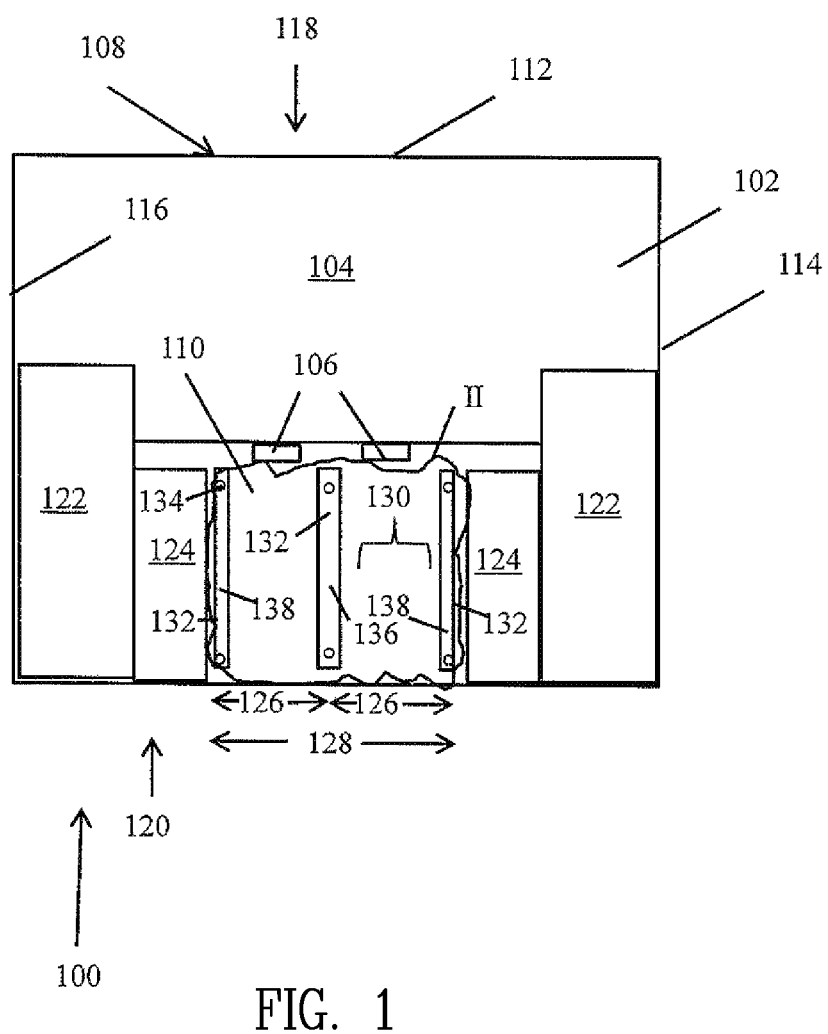
FIG. 1 is top plan view of an electronic device in accordance with one embodiment.

As an overview and in accordance with one embodiment, referring to FIGS. 2, 6-11 together, bottom mounting rails 130 are used to secure a double wide plug-in module 700 or two full wide plug in-modules 1000 into a double wide bay 128 of an electronic device 100.

By using bottom mounting rails 130, allocation of space adjacent to sides 724 of plug-in modules 700 and/or 1000 for mounting structures such as sidewall dividers is avoided. This allows the size of electronic device 100 to be minimized.

Further, the space adjacent to sides 724 of plug-in modules 700 and/or 1000 is left open facilitating airflow through electronic device 100 and efficient cooling thereof.

Further, using bottom mounting rails 130, either a double wide plug-in module 700 or two full wide plug-in modules 1000 can readily be installed without removal or insertion of a mounting structure such as a sidewall divider. Accordingly, removal or installation of sidewall dividers in the field to accommodate different types of plug-in modules is avoided.

Figure 2:
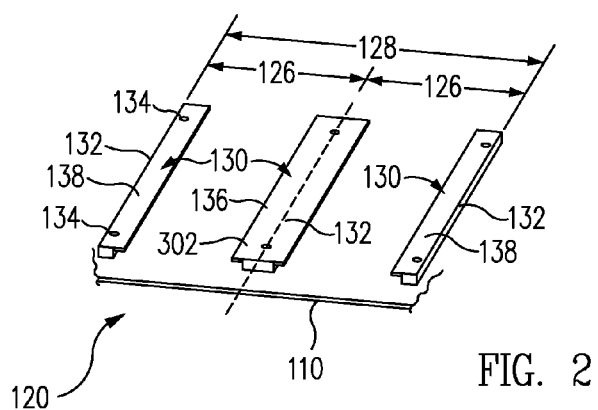
FIG. 2 is an enlarged rear perspective view of a region II of the electronic device of FIG. 1 in accordance with one embodiment.

Now in more detail, FIG. 1 is top plan view of an electronic device 100, sometimes called a pizza box, in accordance with one embodiment. FIG. 2 is an enlarged rear perspective view of a region II of electronic device 100 of FIG. 1 in accordance with one embodiment.

Referring now to FIGS. 1 and 2 together, electronic device 100, e.g., a cryptographic module such as a switch, includes a printed circuit board assembly (PCBA) 102. Printed circuit board assembly 102 includes a printed circuit board 104, sometimes called a larger substrate, and one or more electronic components mounted to printed circuit board 104. Printed circuit board assembly 102 includes blind connectors 106 with which blind mate connectors of plug-in modules connect as described further below.

Printed circuit board assembly 102 is mounted to a chassis base 108, sometimes called a chassis bottom. In accordance with this embodiment, chassis base 108 includes a chassis base plate 110, an optional front plate 112, a first sidewall 114 and a second sidewall 116.

Chassis base plate 110 is a rectangular plate generally parallel to printed circuit board assembly 102. Although various features may be described as being parallel, perpendicular, or having other relations, in light of this disclosure, those of skill in the art will understand that the various features may not be exactly parallel, perpendicular, but only substantially parallel and perpendicular. Further, the features may not be exactly planar, for example, may include indentations or protrusions.

Generally, chassis base plate 110 extends in a first direction, e.g., horizontally. Front plate 112, first sidewall 114, and second sidewall 116 extend perpendicularly vertically upward, e.g., in a second direction perpendicular to the first direction, from chassis base plate 110. For discussion purposes herein, electronic device 100 includes a vertical front face 118 including front plate 112 and various ports therein in a vertical front plane of electronic device 100. Electronic device 100 further includes a vertical rear face 120 that is parallel to front face 118.

Although various features may be described as being horizontal or vertical, it is to be understood that the features extend in a first direction and a perpendicular second direction without a gravitational reference.

First sidewall 114 and second sidewall 116 extend perpendicularly from front plate 112 to rear face 120. First sidewall 114 and second sidewall 116 are parallel to one another.

In accordance with this embodiment, electronic device 100 includes two Power Supply Units (PSUs) 122, and two fan Field Replaceable Units (fan FRUs) 124 at rear face 120. Note fan FRUs 124 are not illustrated in FIG. 2 to allow visualization of various features in accordance with one embodiment as described further below.

Power supply units 122 are directly adjacent sidewalls 114, 116. Adjacent each power supply unit 122 is a fan FRUs 124. Fan FRUs 124 are sometimes called fan trays.

In one embodiment, power supply units 122 and fan FRUs 124 are plug-in modules, sometimes called Field Replaceable Units (FRUs), such that they can be hot swapped. Further, although a particular arrangement of power supply units 122 and fan FRUs 124 is illustrated in FIG. 1 and discussed above, in other embodiments, electronic device 100 includes other plug-in modules, components, and/or other arrangements of power supply units 122 and fan FRUs 124.

In this embodiment, two full (single) wide bays 126 are located between fan FRUs 124. Each full wide bay 126 is an open compartment configured to accommodate, i.e., is wide enough for, a full (single) wide plug-in module.

Full wide bays 126 collectively define a double wide bay 128. Full wide bays 126 and double wide bay 128 are sometimes called plug-in module bays. Double wide bay 128 is approximately double in width of one of full wide bays 126. Double wide bay 128 is an open compartment configured to accommodate, i.e., is wide enough for, two full (single) wide plug-in modules or one double wide plug-in module. In accordance with one embodiment, each plug-in module has a predefined width to allow the plug-in modules to be mixed and matched.

Although full wide bays 126 and double wide bay 128 are described as having widths to accommodate full wide plug-in modules and a double wide plug-in module, generally, a plug-in module bay accommodates one or more plug-in modules, e.g., full, double, triple or larger width plug-in modules.

To guide and mount the one or more plug-in modules into double wide bay 128, bottom mounting rails 130 are provided at the bottom of double wide bay 128. Bottom mounting rails 130 are mounted to chassis base plate 110.

Generally, a bottom mounting rail 130 is located at each side 132 of a plug-in module bay. In accordance with this particular example, a bottom mounting rail 130 is located at sides 132 of full wide plug-in module bays 126 and also at sides 132 of double wide plug-in module bay 128.

In one embodiment, bottom mounting rails 130 are riveted to chassis base plate 110 with rivets 134 and thus are very securely attached. However, in other embodiment, bottom mounting rails 130 are attached using other techniques, e.g., using screws, clips, or other fasteners. Further, in one embodiment, bottom mounting rails 130 are integrally formed with chassis base plate 110, i.e., are parts of a single piece and not single pieces connected together.

Figure 3:
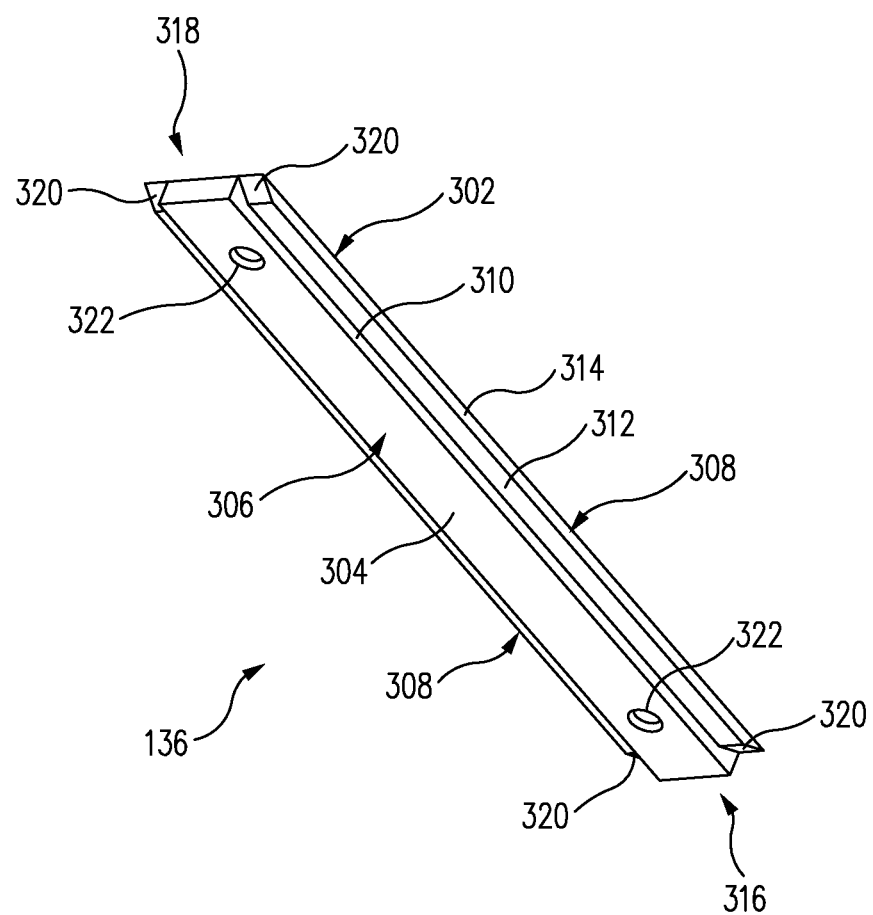
FIG. 3 is a bottom perspective view of a double sided rail of the electronic device of FIGS. 1 and 2 in accordance with one embodiment.
Figure 4:
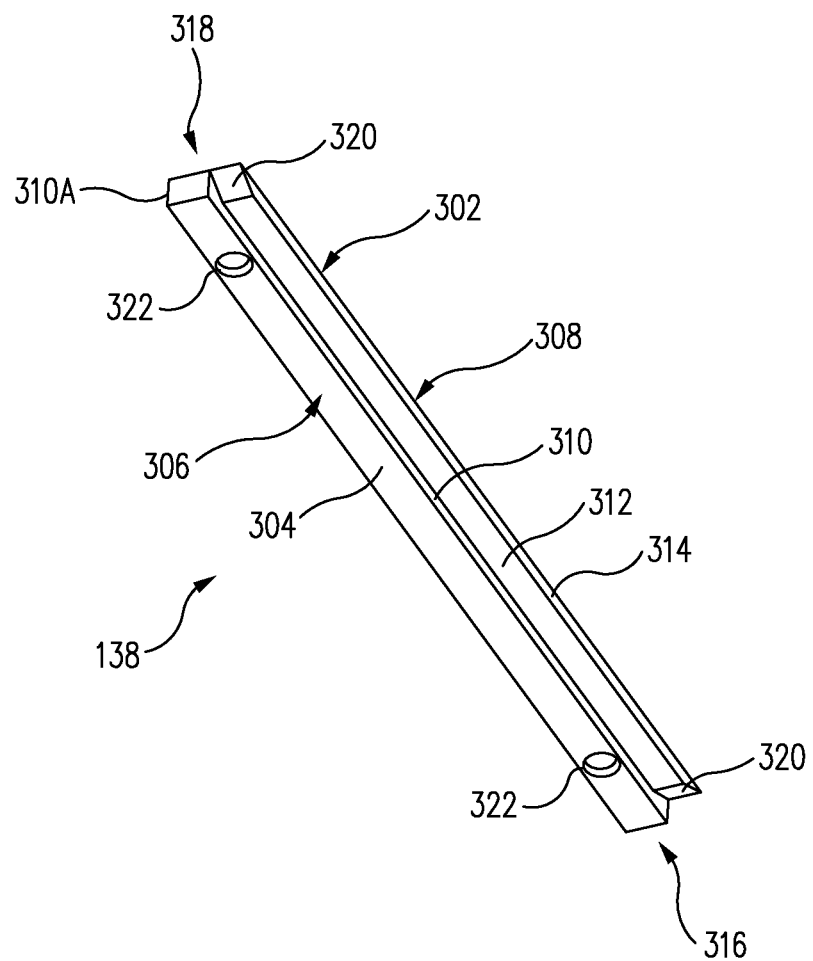
FIG. 4 is a bottom perspective view of a single sided rail of the electronic device of FIGS. 1 and 2 in accordance with one embodiment.

In accordance with this embodiment, bottom mounting rails 130 include a double sided mounting rail 136, sometimes called a middle rail, and two single sided mounting rails 138, sometimes called side rails. FIG. 3 is a bottom perspective view of a double sided mounting rail 136 of electronic device 100 of FIGS. 1 and 2 in accordance with one embodiment. FIG. 4 is a bottom perspective view of a single sided mounting rail 138 of electronic device 100 of FIGS. 1 and 2 in accordance with one embodiment.

Paying particular attention to FIG. 1-3 together, double sided mounting rail 136 includes an upper, e.g., first, surface 302 and an opposite lower, e.g., second, surface 304. Lower surface 304 is parallel to upper surface 302.

In accordance with this embodiment, upper and lower surfaces 302, 304 are rectangular surfaces having lengths greater than widths. The total area of upper surface 302 is greater than the total area of lower surface 304 to define a body portion 306 and two flanges 308, e.g., linear flanges. Flanges 308, sometime called first and second flanges 308, protrude outward from body portion 306 opposite one another and in a plane parallel to chassis base plate 110 and spaced apart from chassis base plate 110.

Upper surface 302 of double sided mounting rail 136 is also the upper surfaces of body portion 306 and flanges 308. Lower surface 304 of double sided mounting rail 136 is also the lower surface of body portion 306. Lower surface 304 is in direct contact with chassis base plate 110. Body portion 306 further includes body sides 310 extending perpendicularly upward from lower surface 304 to flanges 308.

Flanges 308 include lips 312 extending perpendicularly outward from body sides 310 of body portion 306. Lips 312 are rectangular surfaces configured to engage a plug-in module as described below. Flanges 308 further include flange sides 314 extending perpendicularly upward between lips 312 and upper surface 302.

Double sided mounting rail 136 includes a front, e.g., first, end 316 and an opposite rear, e.g., second, end 318. Note that either end 316, 318 can be defined as the front or rear end.

At front and rear ends 316, 318, flanges 308 include vertical tapers 320. Vertical tapers 320 are surfaces extending at an angle to lips 312. Vertical tapers 320 assist in guiding a plug-in module into engagement with lips 312 as discussed further below.

Vertical tapers 320 are optional, and in one embodiment, vertical tapers 320 are not formed and lips 312 extend completely to ends 316, 318. In yet another embodiment, vertical tapers 320 at formed at rear ends 318 only of flanges 308.

Extending through body portion 306 between and perpendicular to upper surface 302 and lower surface 304 are rail mounting apertures 322. Rivets 134 pass through rail mounting apertures 322 to mount double sided mounting rail 136 to chassis base plate 110.

Paying particular attention now to FIGS. 3 and 4 together, single sided mounting rail 138 is similar to double sided mounting rail 136 except includes a single flange 308. Similar reference numbers between single sided mounting rail 138 and double sided mounting rail 136 indicate similar elements the description of which is not repeated for simplicity. Note that the one body side 310A of body portion 306 not having a flange 308 extends perpendicularly and entirely between upper and lower surfaces 302, 304.

Note that the view of FIG. 4 of single sided mounting rail 138 corresponds with single sided mounting rail 138 at the left of FIGS. 1 and 2. However, single sided mounting rail 138 can be rotated 180° into the plane of the page of FIG. 4 to represent single sided mounting rail 138 at the right in FIGS. 1 and 2. Accordingly, the description of single sided mounting rail 138 in reference to FIG. 4 is equally applicable to either the left or right single sided mounting rail 138 in the view of FIGS. 1 and 2.

Figure 5:
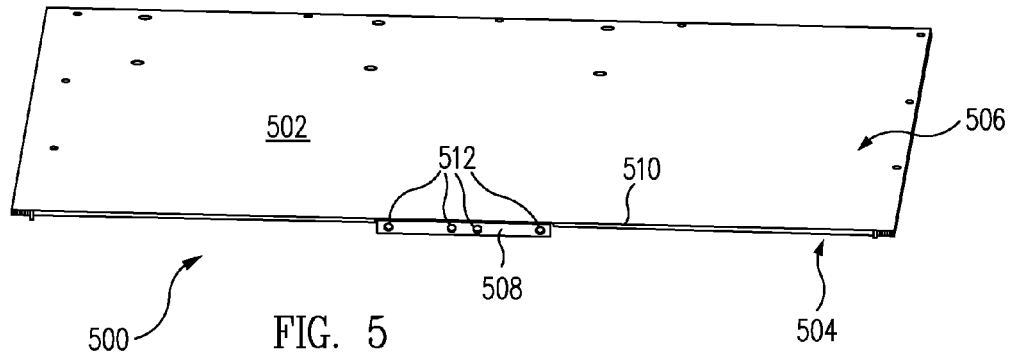
FIG. 5 is an upper perspective view of a cover of the electronic device of FIG. 1 in accordance with one embodiment.

FIG. 5 is an upper perspective view of a cover 500 of electronic device 100 of FIG. 1 in accordance with one embodiment. Note cover 500 is not illustrated in the view of FIG. 1 to allow visualization of chassis base 108 including the components therein.

In accordance with this embodiment, cover 500 includes a rectangular plate 502 parallel to chassis base plate 110 when assembled to chassis base 108. Plate 502 includes an inner surface 504 facing towards chassis base 108 and an outer surface 506 facing the ambient environment.

Cover 500 is mounted to chassis base 108, e.g., using screws or other fasteners, to form an electronic enclosure of electronic device 100.

Cover 500 further includes a fixing panel 508 located at a rear, e.g., first, edge 510 of plate 502. Fixing panel 508 extends perpendicularly downward and in the direction of inner surface 504 from plate 502. Fixing panel 508 is shaped as a rectangular panel in accordance with this embodiment but has other shapes in other embodiments.

Fixing panel 508 includes threaded apertures 512 into which screws of a plug-in module are threaded to secure the plug-in module in place as described further below. In one embodiment, fixing panel 508 includes threaded nuts defining threaded apertures 512. Illustratively, fixing panel 508 includes sheet metal bent from plate 502 as well as threaded nuts coupled, e.g., welded, to the sheet metal.

Figure 6:
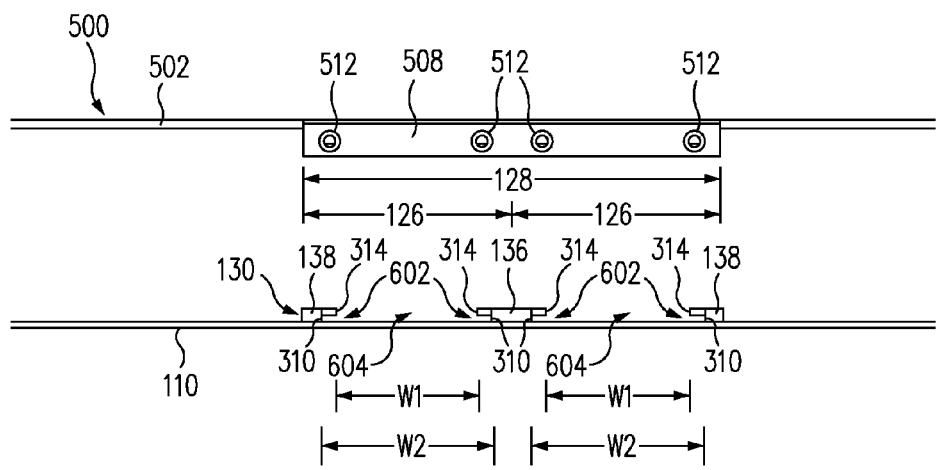
FIG. 6 is a rear plan view of the electronic device of FIG. 1 in accordance with one embodiment.

FIG. 6 is a rear plan view of electronic device 100 of FIG. 1 in accordance with one embodiment. In FIG. 6, only cover 500, chassis base plate 110 of chassis base 108, and bottom mounting rails 130 are illustrated for simplicity. In light of this disclosure, those of skill in the art will understand that other elements such as fan FRUs 124 of electronic device 100 could be visible in the view of FIG. 6.

Figure 7:
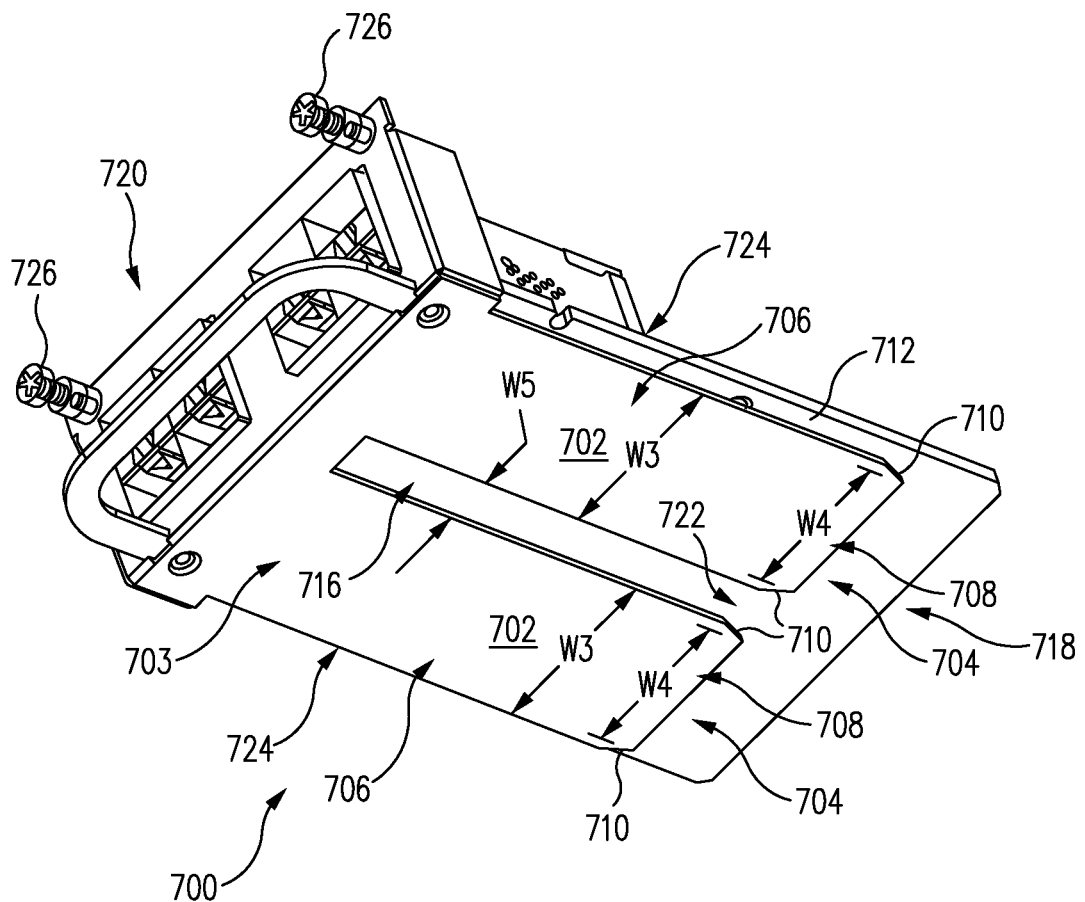
FIG. 7 is a bottom perspective view of a double wide plug-in module in accordance with one embodiment.
Figure 8:
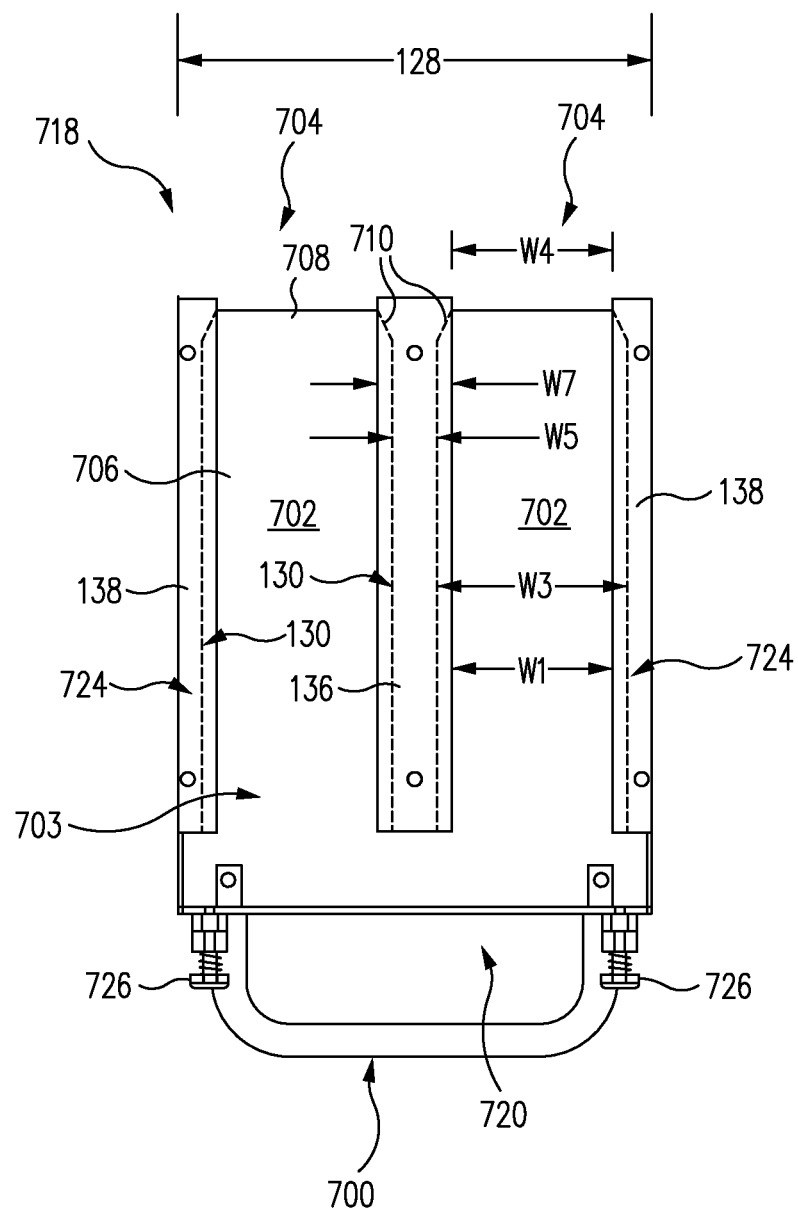
FIG. 8 is a cutaway top plan view of the double wide plug-in module of FIG. 7 mounted within a double wide bay of the electronic device of FIG. 1 in accordance with one embodiment.
Figure 9:
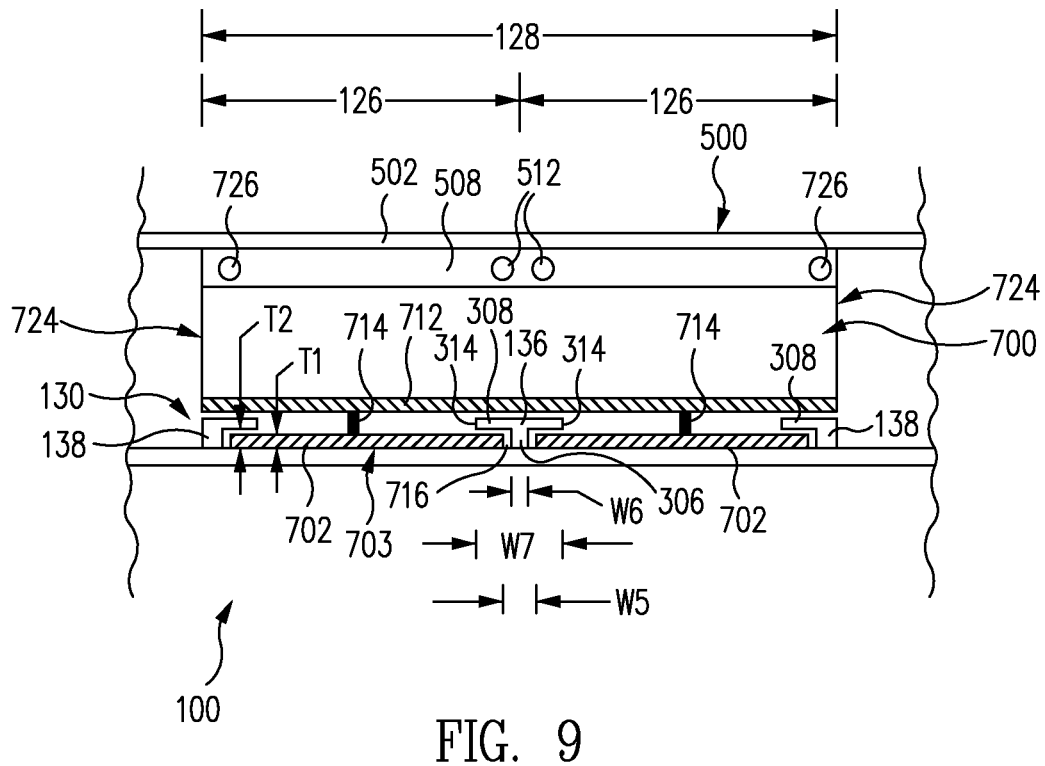
FIG. 9 is a front plan view of the double wide plug-in module of FIG. 7 mounted within the double wide bay of the electronic device of FIG. 1 in accordance with one embodiment.

FIG. 7 is a bottom perspective view of a double wide plug-in module 700 in accordance with one embodiment. FIG. 8 is a cutaway top plan view of double wide plug-in module 700 of FIG. 7 mounted within double wide bay 128 of electronic device 100 of FIG. 1 in accordance with one embodiment. FIG. 9 is a front plan view of double wide plug-in module 700 of FIG. 7 mounted within double wide bay 128 of electronic device 100 of FIG. 1 in accordance with one embodiment.

Referring now to FIGS. 6, 7, 8, and 9 together, bottom mounting rails 130 are located at the bottom of double wide bay 128. Further, fixing panel 508 including threaded apertures 512 are located at the top of double wide bay 128. Generally, full wide bays 126 and double wide bay 128 are compartments between chassis base plate 110 and cover 500 configured to house a plug-in module in accordance with an embodiment as set forth herein.

Grooves 602 are defined by bottom mounting rails 130 and chassis base plate 110. More particularly, grooves 602 are defined by lips 312, body sides 310 and chassis base plate 110. Grooves 602 are long narrow channels extending perpendicular towards front face 118 and from rear face 120 of electronic device 100.

In one embodiment, the width W1 between flange sides 314 of directly adjacent bottom mounting rails 130 is less than a width W2 between body sides 310 of directly adjacent bottom mounting rails 130. Accordingly, an open top slot 604 is defined by facing grooves 602 of directly adjacent bottom mounting rails 130. Slot 604 has width W2. Note width W1 is generally the distance between bottom mounting rails 130.

As there are three bottom mounting rails 130 in the view of FIGS. 6 and 8, there are two slots 604 defined between adjacent bottom mounting rails 130. Each slot 604 accommodates a full wide plug-in module or both slots 604 collectively accommodate a double wide plug-in module such as double wide plug-in module 700 as illustrated in FIGS. 7 and 8.

More particularly, double wide plug-in module 700 includes two mounting tabs 702 which are part of a plug-in module mounting plate 703. Each mounting tab 702 has a width W3 less than width W2 of slot 604 but greater than width W1 between flange sides 314. Further, mounting tabs 702 have a thickness T1 less than a thickness T2 of slot 604 and grooves 602. More particularly, thickness T2 of slot 604 is defined in a direction perpendicular to chassis base plate 110 and is the distance between lips 312 and chassis base plate 110.

Accordingly, mounting tabs 702 are configured to fit within and be secured by slots 604. More generally, mounting tabs 702 fits between and are secured by bottom mounting rails 130.

In one embodiment, to install double wide plug-in module 700, the front ends 704 of mounting tabs 702 are inserted into slots 604. Vertical tapers 320 provide a larger entrance into slots 604 thus facilitating positioning of front ends 704 of mounting tabs 702 into slots 604.

In one embodiment, mounting tabs 702 include tab bodies 706 having width W3 and tab tips 708 at front ends 704 of mounting tabs 702. Tab tips 708 include horizontal tapers 710 extending at an outward angle from front ends 704 of mounting tabs 702. More particularly, tab tips 708 have a varying width varying from a width W4 at front ends 704 to the larger width W3 of tab bodies 706. By providing smaller tab tips 708, it is easier to position front ends 704 of mounting tabs 702 into slots 604. However, having smaller tab tips 708 is optional, and in one embodiment, mounting tabs 702 are formed without smaller tab tips 708 and have a uniform width W3.

In accordance with this embodiment, double wide plug-in module 700 includes a printed circuit board 712, sometimes called a larger substrate or motherboard of double wide plug-in module 700. Printed circuit board 712 is mounted to mounting tabs 702 by standoffs 714.

As illustrated in FIG. 9, standoffs 714 space printed circuit board 712 above bottom mounting rails 130. In accordance with this embodiment, flanges 308 of bottom mounting rails 130 extend horizontally into the space between mounting tabs 702 and printed circuit board 712.

After front ends 704 of mounting tabs 702 are placed within slots 604, double wide plug-in module 700 is slid into position. Slots 604 guide double wide plug-in module 700 into place such that blind mate connectors (not illustrated but see blind mate connectors 1302 of FIG. 13 for example) of double wide plug-in module 700 mate with blind connectors 106 of PCBA 102.

Between mounting tabs 702, a double sided rail slot 716 exists. Double sided rails slot 716 is a linear slot extending perpendicularly from a front face 718 to a rear face 720 of double wide plug-in module 700. Due to horizontal tapers 710, double sided rail slot 716 has a flared opening 722, i.e., is larger in width, at front face 718 of double wide plug-in module 700.

Double sided rail slot 716 has a width W5 greater than a width W6 of body portion 306 between body sides 310 of double sided mounting rail 136. However, width W5 of double sided rail slot 716 is less than a width W7 of flanges 308, i.e., the distance between flanges sides 314. Accordingly, double sided rail slot 716 is configured to slip around double sided mounting rail 136 and be secured thereby. More particularly, double sided rail slot 716 is configured to slip around body portion 306 between flanges 308 and chassis base plate 110.

A distance between double sided rail slot 716 and each side 724 of double wide plug-in module 700 is approximately equal to width W3 of mounting tabs 702.

Rear face 720 of double wide plug-in module 700 includes threaded screws 726, sometimes called thumb screws. Once double wide plug-in module 700 is inserted completely such that rear face 720 abuts fixing panel 508, screws 726 are threaded into threaded apertures 512 of fixing panel 508. This finalizes installation of double wide plug-in module 700 into electronic device 100. Double wide plug-in module 700 is removed in the opposite manner as inserted.

Figure 10:
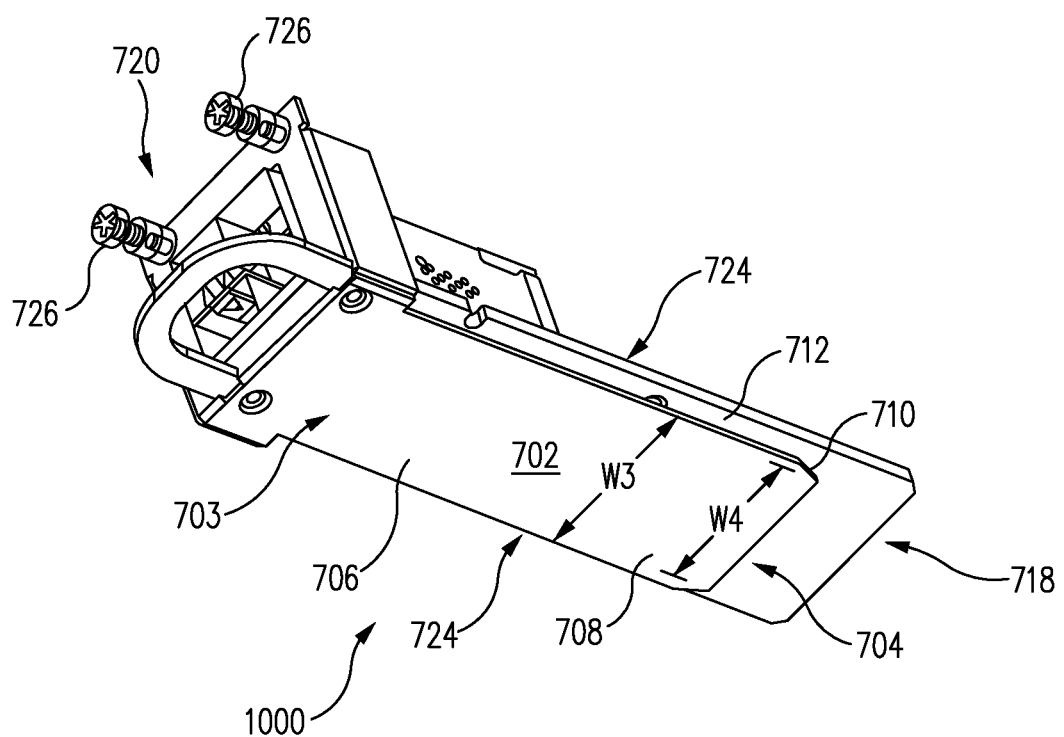
FIG. 10 is a bottom perspective view of a full wide plug-in module in accordance with one embodiment.

FIG. 10 is a bottom perspective view of a full wide plug-in module 1000 in accordance with one embodiment. Full wide plug-in module 1000 of FIG. 10 is similar to double wide plug-in module 700 of FIG. 7 except is approximately half the width. Similar reference numbers indicate similar elements between full wide plug-in module 1000 and double wide plug-in module 700 and only the significant differences are described below.

Figure 11:
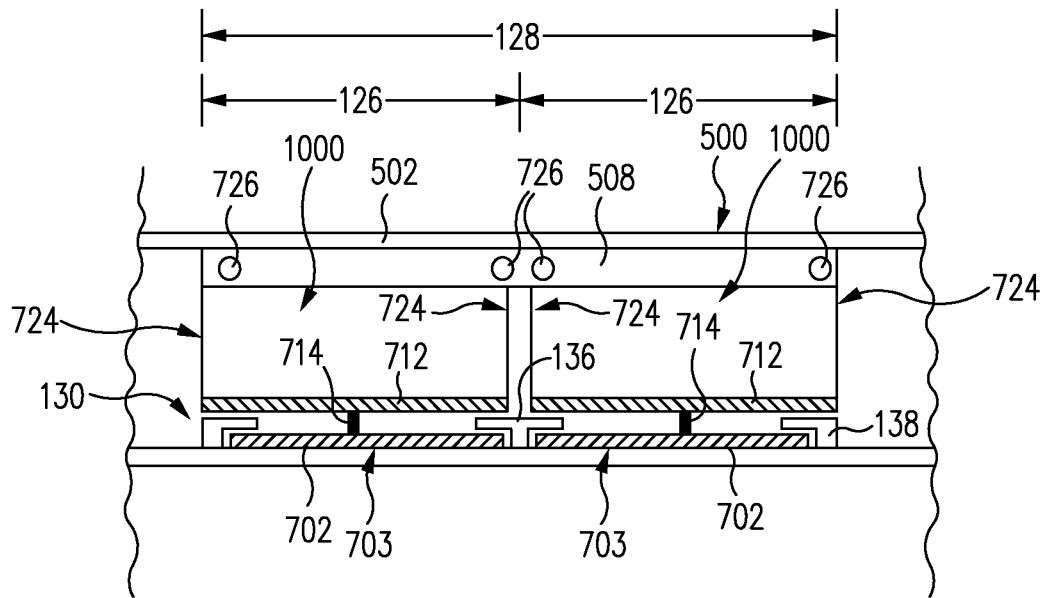
FIG. 11 is a front plan view of a pair of the full wide plug-in modules of FIG. 10 mounted within the double wide bay of the electronic device of FIG. 1 in accordance with one embodiment.

FIG. 11 is a front plan view of a pair of full wide plug-in modules 1000 of FIG. 10 mounted within full wide bays 126, i.e., within double wide bay 128, of electronic device 100 of FIG. 1 in accordance with one embodiment.

Referring now to FIGS. 6, 10, and 11 together, full wide plug-in module 1000 includes a single mounting tab 702. Mounting tab 702 is configured to fit within and be secured by slots 604. More generally, mounting tab 702 of full wide plug-in module 1000 fits between and is secured by bottom mounting rails 130.

As illustrated in FIG. 11, a full wide plug-in module 1000 is fit between each single sided mounting rail 138 and the center double sided mounting rail 136. Thus, two full wide plug-in modules 1000 are mounted within double wide bay 128.

In other embodiments, other components are mounted using bottom mounting rails 130 in a similar manner. For example, PSUs 122 and/or fan FRUs 124 of FIG. 1 are mounted using bottom mounting rails 130.

As set forth above, using bottom mounting rails 130, allocation of space adjacent to sides 724 of plug-in modules 700 and/or 1000 for mounting structures such as sidewall dividers is avoided. This allows the size of electronic device 100 to be minimized. Further, the space adjacent to sides 724 of plug-in modules 700 and/or 1000 is left open facilitating airflow through electronic device 100 and efficient cooling thereof.

Further, using bottom mounting rails 130, either a double wide plug-in module 700 or two full wide plug-in modules 1000 can readily be installed without removal or insertion of a mounting structure such as a sidewall divider. Accordingly, removal or installation of sidewall dividers in the field to accommodate different types of plug-in modules is avoided.

Figure 12:
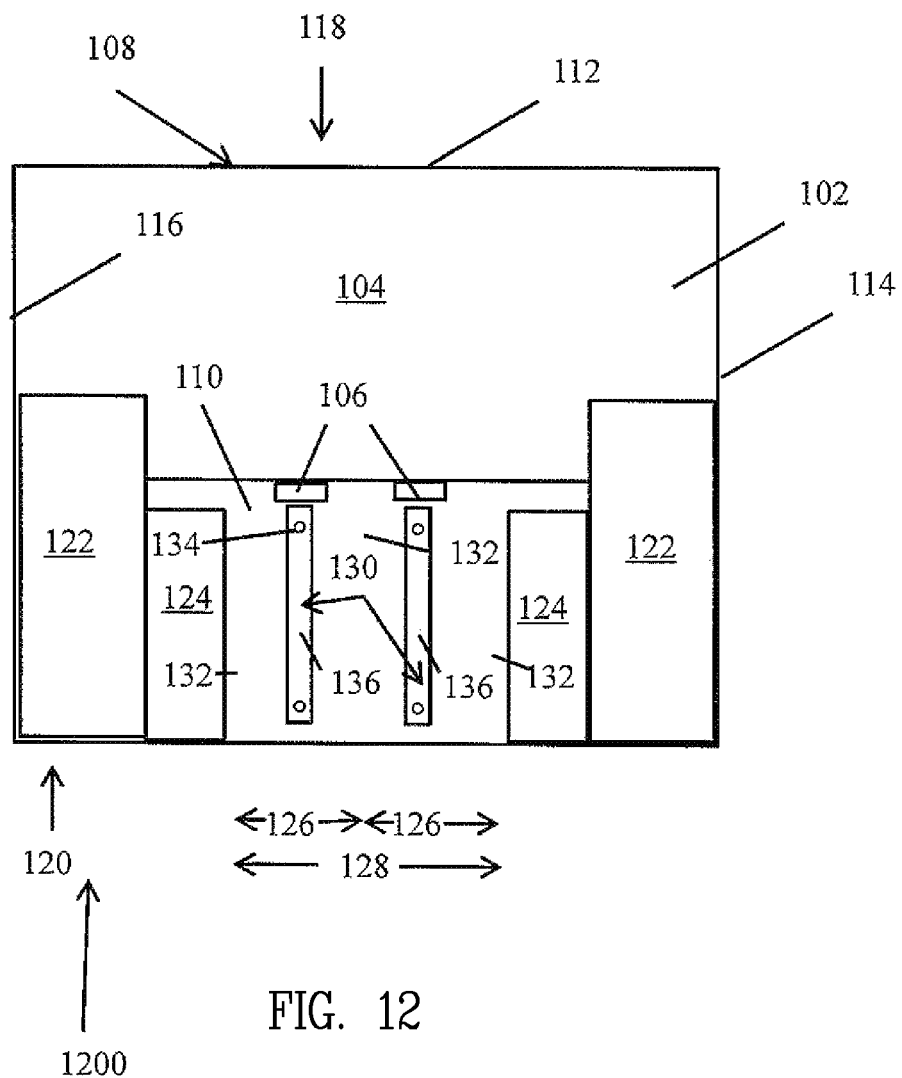
FIG. 12 is top plan view of an electronic device having centered double sided rails in accordance with one embodiment.

FIG. 12 is top plan view of an electronic device 1200 having centered double sided mounting rails 136 in accordance with one embodiment. Electronic device 1200 of FIG. 12 is similar to electronic device 100 of FIG. 1 with the exception that all of bottom mounting rails 130 are double sided mounting rails 136 that are centrally located for each full wide plug-in module bay 126 of electronic device 100. Although full wide plug-in module bay 126 are illustrated as being at rear face 120, one or more full wide plug-in module bays 126 are located at front face 118 in other embodiments.

More particularly, a double sided mounting rail 136 is located at the center and approximately equidistant from sides 132 of each full wide plug-in module bay 126.

Figure 13:
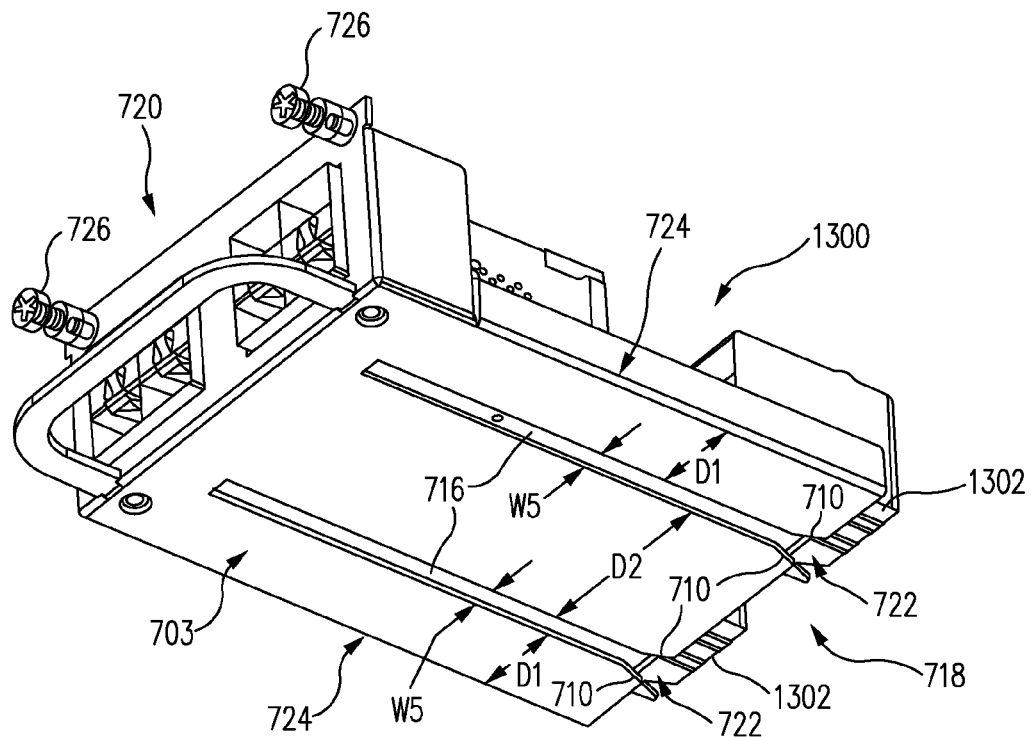
FIG. 13 is a bottom perspective view of a double wide plug-in module in accordance with one embodiment.

FIG. 13 is a bottom perspective view of a double wide plug-in module 1300 in accordance with one embodiment. Double wide plug-in module 1300 of FIG. 13 is substantially similar to double wide plug-in module 700 of FIG. 7 except that double wide plug-in module 1300 includes two double sided rail slots 716 in plug-in module mounting plate 703 configured to mount to double sided mounting rails 136 of electronic device 1200 of FIG. 12. Note blind mate connectors 1302 of double wide plug-in module 1300 are illustrated in FIG. 13. The blind mate connectors of various plug-in modules as described herein are not always illustrated in the figures for simplicity.

Figure 14:
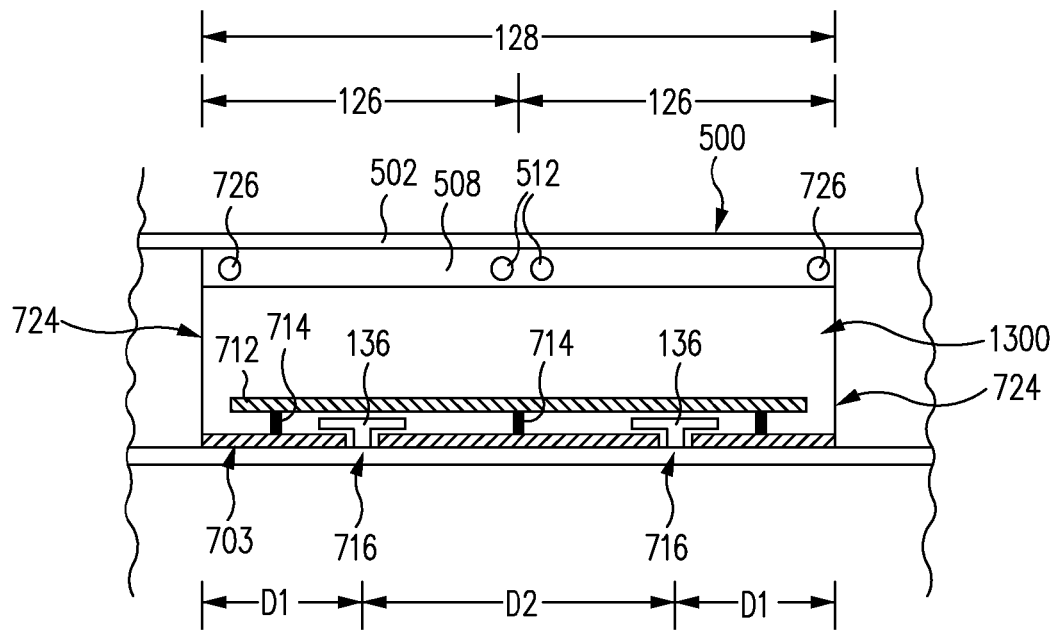
FIG. 14 is a front plan view of the double wide plug-in module of FIG. 13 mounted within a double wide bay of the electronic device of FIG. 12 in accordance with one embodiment.

FIG. 14 is a front plan view of double wide plug-in module 1300 of FIG. 13 mounted within double wide bay 128 of electronic device 1200 of FIG. 12 in accordance with one embodiment.

A distance D1 between the nearest side 724 and the respective double sided rail slot 716 in a direction parallel to rear face 720 is approximately equal. Further, a distance D2 between double sided rail slots 716 in a direction parallel to rear face 720 is approximately equal to twice distance D1.

Double sided rail slots 716 are thus aligned with each double sided mounting rail 136. Accordingly, double sided rail slots 716 slide around double sided mounting rails 136 to mount double wide plug-in module 1300 within double wide bay 128. Screws 726 are then threaded into threaded apertures 512 to complete installation of double wide plug-in module 1300 in one embodiment.

Figure 15:
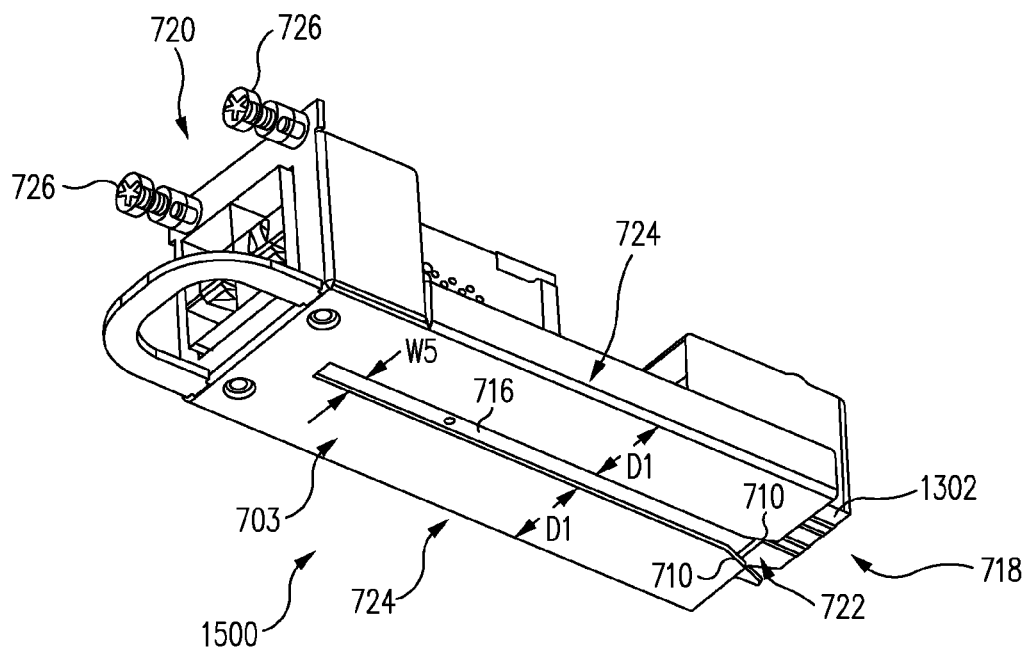
FIG. 15 is a bottom perspective view of a full wide plug-in module in accordance with one embodiment.

FIG. 15 is a bottom perspective view of a full wide plug-in module 1500 in accordance with one embodiment. Full wide plug-in module 1500 of FIG. 15 is substantially similar to full wide plug-in module 1000 of FIG. 10 except that full wide plug-in module 1500 includes a single centered double sided rail slot 716 configured to mount to a double sided mounting rail 136 of electronic device 1200 of FIG. 12.

Figure 16:
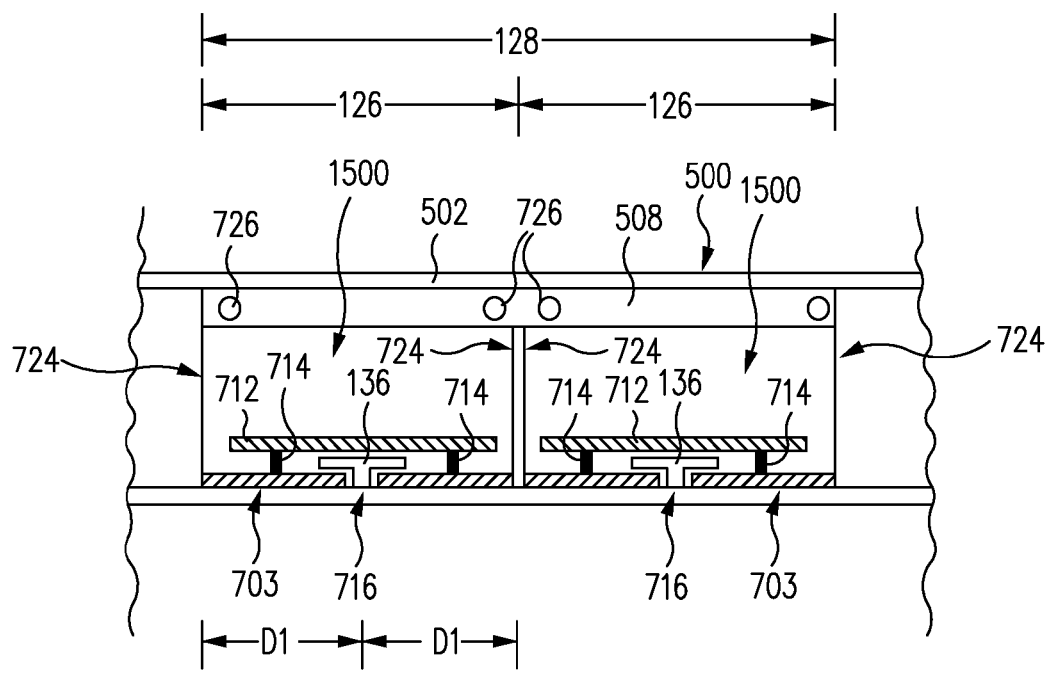
FIG. 16 is a front plan view of a pair of the full wide plug-in modules of FIG. 15 mounted within the double wide bay of the electronic device of FIG. 12 in accordance with one embodiment.

FIG. 16 is a front plan view of two full wide plug-in modules 1500 of FIG. 15 mounted within double wide bay 128 of electronic device 1200 of FIG. 12 in accordance with one embodiment A distance D1 between each side 724 and double sided rail slot 716 in a direction parallel to rear face 720 is approximately equal. Double sided rail slot 716 is thus centered for a corresponding one of double sided mounting rail 136.

Accordingly, double sided rail slot 716 slides around a corresponding one of double sided mounting rails 136 to mount full wide plug-in module 1500 within double wide bay 128. In one embodiment, two full wide plug-in modules 1500 are mounted side-by-side within double wide bay 128, i.e., each within one of full wide bays 126. Screws 726 are then threaded into threaded apertures 512 to complete installation of full wide plug-in modules 1500 in one embodiment.

The drawings and the forgoing description gave examples of embodiments. The scope of the embodiments, however, is by no means limited by these specific examples. Numerous variations, whether explicitly given in the specification or not, such as differences in structure, dimension, and use of material, are possible.

What is claimed is:

1. A structure comprising:
a chassis base comprising a planar chassis base plate; and
a bottom mounting rail coupled to the chassis base plate, the bottom mounting rail comprising:
a first surface;
a second surface opposite the first surface, the second surface contacting the chassis base plate;
a body portion; and
a first flange protruding outward from the body portion,
wherein the body portion comprises a body side extending from the second surface to the first flange and the first flange comprises a lip extending outward from the body side, the chassis base plate, the body side, and the lip defining a groove,
wherein the first surface of the bottom mounting rail comprises a first surface of the body portion and a first surface of the first flange.

2. The structure of claim 1 wherein the first surface has a greater area than the second surface.

3. The structure of claim 1 further comprising rivets coupling the bottom mounting rail to the chassis base plate.

4. The structure of claim 1 wherein the bottom mounting rail further comprises a second flange protruding outward from the body portion opposite the first flange.

5. The structure of claim 1 further comprising a plug-in module comprising:
a plug-in module plate comprising a mounting tab located within the groove;
a substrate; and
standoffs mounting the substrate to the mounting tab, the first flange extending into a space between the mounting tab and the substrate.

6. A structure comprising:
a chassis base comprising a chassis base plate;
a cover coupled to the chassis base;
a bay between the chassis base and the cover configured to house a plug-in module, the cover comprising a fixing panel comprising threaded apertures at the bay, the plug-in module comprising a rear face comprising threaded screws configured to be coupled to the threaded apertures of the fixing panel to secure the plug-in module in place; and
a bottom mounting rail coupled to the chassis base at the bay.

7. The structure of claim 6 wherein the bottom mounting rail is located at a middle of the bay.

8. The structure of claim 7 wherein
the plug in module comprises a plug-in module mounting plate comprising a double sided rail slot configured to fit around the bottom mounting rail.

9. The structure of claim 8, wherein the bottom mounting rail comprises:
a body portion having a first width;
flanges having a second width, wherein the double sided rail slot has a third width greater than the first width and less than the second width.

10. The structure of claim 9 wherein the plug-in module mounting plate is located around the body portion.

11. The structure of claim 10 wherein the plug-in module plate is further located between the flanges and the chassis base plate.

12. The structure of claim 6 further comprising a plurality of bottom mounting rails comprising the bottom mounting rail, the bottom mounting rails coupled to the chassis base plate at sides of the bay.

13. The structure of claim 12 wherein the bottom mounting rails define a slot, the plug-in module comprising a plug-in module mounting plate configured to fit into the slot.

14. The structure of claim 13 wherein the bottom mounting rails comprise:
flanges comprising flange sides; and
body portions comprising body sides, a first width between the flange sides of adjacent bottom mounting rails being less than a second width between body sides of adjacent bottom mounting rails, the plug-in module mounting plate comprising a mounting tab having a third width greater than the first width and less than the second width.

15. A structure comprising:
a chassis base comprising a chassis base plate;
a plurality of bottom mounting rails coupled to the chassis base plate, the plurality of bottom mounting rails defining two slots, each bottom mounting rail comprising:
a body portion; and
at least one flange protruding outward for the body portion; and
a double wide plug-in module secured within the two slots, wherein the double wide plug-in module comprises:
a plug-in module plate comprising two mounting tabs located within the two slots;
a substrate; and
standoffs mounting the substrate to the two mounting tabs, the flanges extending into a space between the two mounting tabs and the substrate.

16. The structure of claim 15 further comprising:
a cover coupled to the chassis base, wherein the double wide plug-in module is secured to a fixing panel of the cover.

* * * * *